(12) United States Patent
Chen

(10) Patent No.: US 7,168,160 B2
(45) Date of Patent: Jan. 30, 2007

(54) METHOD FOR MOUNTING AND HEATING A PLURALITY OF MICROELECTRONIC COMPONENTS

(75) Inventor: Jimmy Kuo Chen, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 199 days.

(21) Appl. No.: 10/027,476

(22) Filed: Dec. 21, 2001

(65) Prior Publication Data

US 2003/0115749 A1 Jun. 26, 2003

(51) Int. Cl.
H05K 3/34 (2006.01)
H01R 43/20 (2006.01)

(52) U.S. Cl. .......................... 29/840; 29/839; 29/843; 29/874; 29/884; 148/525; 148/565; 219/602; 219/636

(58) Field of Classification Search ................. 29/848, 29/DIG. 13, DIG. 21, 840, 842, 843, 845, 29/839, 874, 876, 884, 885; 148/525, 565; 219/602, 605, 615, 616, 632, 635–636, 764–765, 219/770

See application file for complete search history.

(56) References Cited

U.S. PATENT DOCUMENTS

| | | | | |
|---|---|---|---|---|
| 2,393,541 | A | * | 1/1946 | Kohler ......................... 219/634 |
| 4,983,804 | A | * | 1/1991 | Chan et al. .................. 219/616 |
| 5,340,537 | A | * | 8/1994 | Barrett ........................ 422/26 |
| 5,374,809 | A | * | 12/1994 | Fox et al. .................... 148/573 |
| 5,418,811 | A | * | 5/1995 | Ruffini et al. ............... 373/152 |
| 5,476,211 | A | | 12/1995 | Khandros |
| 5,710,413 | A | * | 1/1998 | King et al. .................. 219/633 |
| 5,917,707 | A | | 6/1999 | Khandros et al. |
| 5,974,662 | A | | 11/1999 | Eldridge et al. |
| 6,150,186 | A | | 11/2000 | Chen et al. |
| 6,184,053 | B1 | | 2/2001 | Eldridge et al. |
| 6,229,126 | B1 | * | 5/2001 | Ulrich et al. ................ 219/635 |
| 6,255,126 | B1 | | 7/2001 | Mathieu et al. |
| 6,268,015 | B1 | | 7/2001 | Mathieu et al. |
| 6,336,269 | B1 | | 1/2002 | Eldridge et al. |
| 6,482,013 | B2 | | 11/2002 | Eldridge et al. |
| 6,672,875 | B1 | | 1/2004 | Mathieu et al. |
| 2001/0044225 | A1 | | 11/2001 | Eldridge et al. |
| 2002/0055282 | A1 | | 5/2002 | Eldridge et al. |
| 2002/0164893 | A1 | | 11/2002 | Mathieu et al. |
| 2003/0099737 | A1 | | 5/2003 | Eldridge et al. |

FOREIGN PATENT DOCUMENTS

| | | |
|---|---|---|
| WO | WO 98/52224 A1 | 11/1998 |
| WO | WO 02/063682 A2 | 8/2002 |

* cited by examiner

Primary Examiner—Minh Trinh
Assistant Examiner—Donghai D. Nguyen
(74) Attorney, Agent, or Firm—N. Kenneth Burraston

(57) ABSTRACT

A method for heat-treating a plurality of microelectronic structures attached to a non-metallic substrate is disclosed. The method comprises the steps of: (a) placing the non-metallic substrate and the plurality of microelectronic structures in an oscillating electromagnetic field, whereby the plurality of microelectronic structures are heated by the oscillating electromagnetic field and the non-metallic substrate is essentially not heated by the oscillating electromagnetic field; (b) maintaining the non-metallic substrate and the plurality of microelectronic structures in the oscillating electromagnetic field until each of the plurality of microelectronic structures obtains a defined heat-treatment temperature substantially greater than an ambient temperature; (c) removing the non-metallic substrate and the plurality of microelectronic structures from the oscillating electromagnetic field; and (d) cooling the plurality of microelectronic structures to the ambient temperature.

20 Claims, 7 Drawing Sheets

METHOD FOR MOUNTING AND HEATING A PLURALITY OF MICROELECTRONIC COMPONENTS

BACKGROUND OF THE INVENTION

1. Field of the Invention

The present invention relates to methods and systems for processing microelectronic components using heat, and more particularly to a method and system for heat-treating a resilient microstructure using inductive heating.

2. Description of Related Art

In the manufacture of microelectronic components it has been found advantageous to heat treat (e.g., anneal, harden, temper, etc.) the components at temperatures below the softening point of component materials at various times during a manufacturing process. Such heat treatment may be used to improve and/or stabilize the mechanical properties of the components, particularly for microelectro-mechanical components for which stable mechanical properties are desired under varying load and temperature conditions. For example, component materials may be made less brittle, provided with higher yield strengths, and made more resistant to material fatigue, with appropriate heat treatment. In addition, by heat-treating a component material at a temperature above its anticipated operating environment, the stability of the material properties during operation may be assured. Besides heat-treatment, heating of microelectromechanical components may be performed for other reasons, such as to solder or braze components together, to evaporate solvents, or to evaporate organic contaminants.

Heating of microelectro-mechanical components is typically performed by exposing the component to a heated, temperature-controlled environment such as provided by a convection oven or infrared heater. The component is cycled through a defined time-temperature profile, depending on the purpose of the heat treatment. For example, electroplated nickel (Ni) and nickel alloy coatings may be annealed for stress relief at 700° C. for one to two hours. Generally, a given result may be achieved faster at higher treatment temperatures, within certain limits that are known in the art, or that may be discovered by experimentation.

SUMMARY OF THE INVENTION

The present invention provides for heat-treatment of micro-electro-mechanical components by exposing the components to an oscillating electromagnetic field. Because the components are of relatively low mass, effective component heating may be achieved at relatively low power levels. As an example, the frequency of the electromagnetic field may be tuned between about 10 MHz–15 MHz as necessary to resonate with the field generator circuit, including the load created by the article to be heated. The foregoing frequency range is not, however, limiting, and other frequencies outside this range may be used. For typical microelectromechanical components, the load is very small or negligible. The circuit capacitance ("tank capacitance") is then manually adjusted to match the impedance between the power supply and the circuit.

In an embodiment of the invention, a plurality of microelectronic spring elements are mounted on a non-metallic, non-magnetic substrate, such as a ceramic substrate. Such a configuration may be used, for example, in interposers and contactors. The substrate comprises a relatively thin plate that is suspended between and parallel to plates of a electromagnetic field generator circuit. The field generator plates are parallel to one another and extend beyond the periphery of the substrate. Accordingly, a generally uniform electromagnetic field is generated between the parts through the substrate carrying the springs to be heated.

In another embodiment, a thin planar substrate is placed inside the arms of a hairpin coil. The hairpin coil is then scanned over the surface of the substrate, heating the microelectronic springs under the arms of the coil in turn.

In another embodiment of the invention, the energy from the electromagnetic field is used for soldering or brazing components of a microelectronic spring.

In another embodiment of the invention, a selective heating effect provided by the inductive heating method is enhanced by constructing the materials to be heated (and/or adjacent materials) from a ferromagnetic material. One useful ferromagnetic material for microelectronic spring contact applications is a nickel-cobalt alloy. The nickel cobalt alloy provides strength and resiliency for the spring contact, and may be heated more rapidly than adjacent non-ferromagnetic components by an oscillating electromagnetic field.

A more complete understanding of the method and system for inductive heating of microelectronic components will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention provides a method for heating a plurality of microelectronic structures attached to a non-metallic substrate, that overcomes the limitations of prior art heating methods for such articles. In the detailed description that follows, like element numerals are used to indicate like elements that appear in one or more of the figures.

Figure 1:
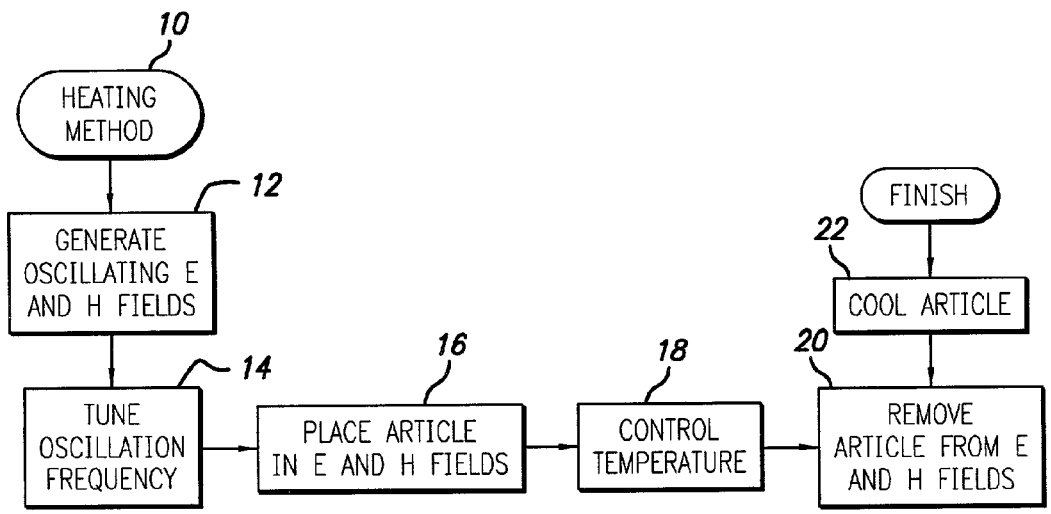
FIG. 1 is a flow diagram showing exemplary steps of a method according to an exemplary embodiment of the invention.

FIG. 1 shows an exemplary sequence of steps for an inductive heating method 10 according to an embodiment of the invention. As an initial step 12, an oscillating electromagnetic field (E and H fields) is generated over a defined region. Preferably, the electromagnetic field is generally uniform over the defined region and oscillates at a frequency and power level useful for heating an article comprised of a non-metallic substrate and a plurality of separate microelectronic structures. Further details of coils or plates useful for generating a suitable field are described later in the specification.

A field with an oscillation frequency between about 10 MHz to 15 MHz, generated by a circuit with a power rating of about 1 kW, is suitable for heating small electronic components, such as an interposer comprising a flat ceramic substrate with two opposing square-shaped surfaces, each measuring about 2.5 inches (about 6.3 cm) on each side and having a large plurality of resilient microelectronic springs thereon. The non-metallic material may also be a semiconductor material such as a silicon wafer material, with or without an internal semiconductor device or integrated circuit. Circuits for generating oscillating electromagnetic fields within the desired frequency range are known in the art. It should be noted, however, that the invention is not limited to the foregoing preferred frequency range, power rating, or size and type of electronic component.

The oscillation frequency is preferably tuned as shown at step 14 to the resonant frequency of the field generating circuit, including the load imposed by the article to be heated. For microelectronic applications, the inductive load imposed by the microelectronic structures will be quite small, and in some cases, negligible. Also, little or no load is imposed by the non-metallic substrate. Accordingly, the resonant frequency will typically be determined by the characteristics of the field generating circuit and coil.

At step 16, an article to be heated is placed in the oscillating electromagnetic field. Any suitable method of placing the article may be used. For example, the article may be placed on a non-metallic tray or other support inside of the field coil with the circuit powered off, and then the circuit may be powered up. In the alternative, for assembly line processes, it may be advantageous to convey the article through the coil while the circuit is constantly powered. Various conveyance methods may be used, such as a non-metallic conveyor belt or robotic arm.

At step 18, the article is maintained inside of the oscillating electromagnetic field until a defined heat-treatment temperature is obtained in each of a selected plurality of the microelectronic structures on the article. For some heat-treatment applications, it is further desirable to achieve a defined time-temperature profile in each of the separate microelectronic structures to be heated. To control the heat-treatment temperature obtained, and/or the time-temperature profile, one or more of at least four parameters may be controlled: (1) the configuration of the electromagnetic field; (2) the oscillation frequency; (3) the electrical power supplied to the field generator circuit; and (4) the ambient heat transfer environment. For a given configuration, each of the foregoing factors may be held relatively constant. Accordingly, once the equipment and environmental parameters are determined and stabilized, the temperature of the microelectronic structures may be measured at various times during the heating process. Any of the foregoing parameters may then be adjusted as appropriate to achieve the desired temperature control.

Because of the extremely small size of each microelectronic structure, it may be difficult to directly measure its temperature. It may be possible to devise a temperature sensing device, such as an infrared sensor with a microscopic aperture, capable of directly measuring the temperature of an individual microelectronic structure. Conventional temperature measurement devices, such as thermocouples, however, may be too large to measure the temperature of microelectronic structures directly. Thermocouples may be subject to the further disadvantage of being directly heated by oscillating electromagnetic fields. Accordingly, one may employ a method for inferring the temperature of the microelectronic structures by taking an indirect temperature measurement or other observation.

For example, a surface of the article and the microelectronic structures thereon may be coated with a heat-indicating paint. The heat-indicating paint may be configured to change color at one or more defined temperatures. Various such paints are known in the art. Such paints are particularly advantageous for showing any uneven heating that may be occurring across the surface of the article. In the alternative, or in addition, an infrared sensor may be used to measure the temperature of the surface of the article at selected locations, or in a scanning mode. Both heat-indicating paints and infrared sensors are subject to the disadvantage that the temperature of the typically much more massive, non-metallic substrate dominates the measured temperature. The much less massive microelectronic structures may be, and typically are, much hotter than the surrounding non-metallic substrate to which they are attached. A relationship between the substrate temperature and the temperature of the microelectronic structures for a given configuration of article may be deduced using empirical observations.

For example, the physical properties, e.g., resilient properties of the microelectronic structures may be measured. Such empirical observations may be especially relevant for heat-treatment of microsprings of the type disclosed in U.S. Pat. No. 6,150,186. The yield strength and/or spring constant of such structures may be significantly increased by a phase change that occurs during heat treatment. Therefore, these and related physical properties of the microelectronic structures may be measured to determine whether the desired phase change has occurred. In the alternative, or in addition, the grain or crystal structure of the structures may be observed microscopically, or using a diffraction method. For applications where components of the structures are to be joined by activating a solder, braze, conductive adhesive, gold/tin eutectic alloy, or similar joining material by inductive heating of the components, the temperature obtained may be deduced by observing when the joining material is activated.

In the alternative, or in addition, very small dots or regions of any material that changes state at a defined temperature may be deposited at selected locations on the substrate and/or the plurality of microelectronic structures, prior to placing the article to be heated in the oscillating electromagnetic field. An array of dots or regions may be deposited, wherein each dot or region will change state at a different defined temperature. The dots or regions may then be observed during or after the article is heated in the electromagnetic field, to determine the temperature across the article. A wide variety of materials may be used for depositing in the dots or regions. For example, heat-indicating paints may be used. For further example, dots of solder paste that are activated at a defined temperature may be used. One skilled in the art may identify a wide variety of suitable materials for temperature indicating purposes.

At step 20, the article is removed from the oscillating electromagnetic field. This may be accomplished, for example, by powering off the field generating circuit, or by physically removing the article from the field coil. At step 22, the article is then cooled to an ambient temperature, completing the process cycle of method 20. Because of the small mass of the microelectronic structures, cooling may be accomplished very quickly, if desired.

Figure 2:
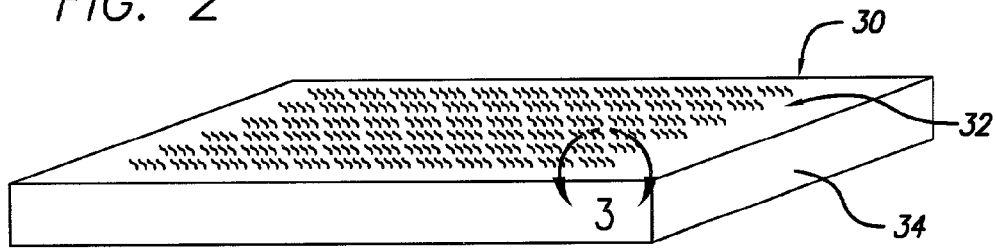
FIG. 2 is a perspective view of an exemplary article to be processed by the method, the article comprising a non-metallic substrate and a plurality of microelectronic structures.

FIG. 2 shows a perspective view of an exemplary article 30 that may be processed using method 10. Article 30 may comprise an interposer or contactor for contacting a semiconductor wafer, a semiconductor wafer, or any other component comprised of a generally non-metallic substrate 34 with a plurality of microelectronic structures 32 attached to at least one surface of the substrate. The microelectronic structures 32 are electrically conductive.

Preferably, at least a portion or component of each microelectronic structure is made up of a ferromagnetic material thereby enhancing the selectivity with which each structure may be heated. For example, one suitable ferromagnetic material for spring contact applications is a nickel-cobalt alloy. Ferromagnetic materials can be selectively heated using an oscillating electromagnetic field because the field will couple to the magnetic dipoles in the ferromagnetic material and induce oscillation of the dipoles, thereby heating the material. In addition, the ferromagnetic material, also being electrically conductive, will be inductively heated by induced electric currents in the usual manner. The oscillating electromagnetic field can be tuned to achieve a maximal degree of magnetic coupling with the ferromagnetic material, so that heating of the material is mainly caused by magnetic coupling, instead of by inductive heating. Tuning the field in this manner achieves selective heating of ferromagnetic materials, even when adjacent to other electrically conductive by non-ferromagnetic materials. Non-ferromagnetic, electrically conductive materials (for example, copper, silver, or gold) in the microelectronic structure 32 will be heated primarily by induction of electric current.

As shown in FIG. 2, the mass and size of each microelectronic structure, and of the plurality of structures 32 as a whole, are typically small relative to the mass and size of the non-metallic substrate 34. Substrate 34 may be comprised primarily of various non-metallic materials, such as ceramic or organic polymer materials. It may further comprise a relatively small amount of metallic materials, such as a thin metallic layer. The substrate may be provided with various other features, such as holes, recesses, protrusions, or walls, without departing from the scope of the invention. In addition, the substrate need not have a primarily planar shape as shown in FIG. 2.

Figure 3:
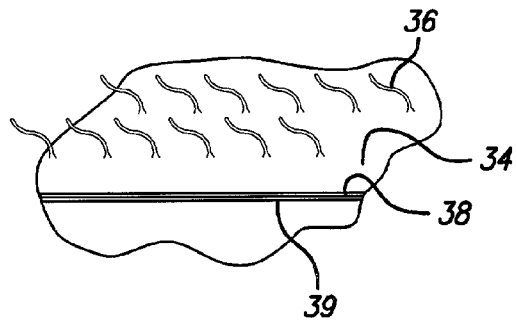
FIG. 3 is an enlarged view an exemplary portion of the article shown in FIG. 2.

FIG. 3 shows an enlarged view of the substrate 34 and exemplary individual microelectronic resilient spring contacts, such as contact 36, comprising the plurality of microelectronic structures 32. Contact 32 comprises a shaped soft wire core, such as a gold wire core, ball-bonded to substrate 34 and coated with a relatively thick layer of resilient material, such as a NI—Co alloy. Structures 32 may include any type of microelectronic structure, and are not limited to structures of the type shown in FIG. 3. For example, structures 32 may comprise components that are deposited by a method such as electroplating, electroless plating, chemical vapor deposition, physical vapor deposition, or any other suitable method, into patterns defined by application of suitable masking layers. Furthermore, substrate 34 may comprise additional features, such as a layer of heat-indicating paint 38 or layer of conductive material 39, such as a shorting layer.

Figure 4:
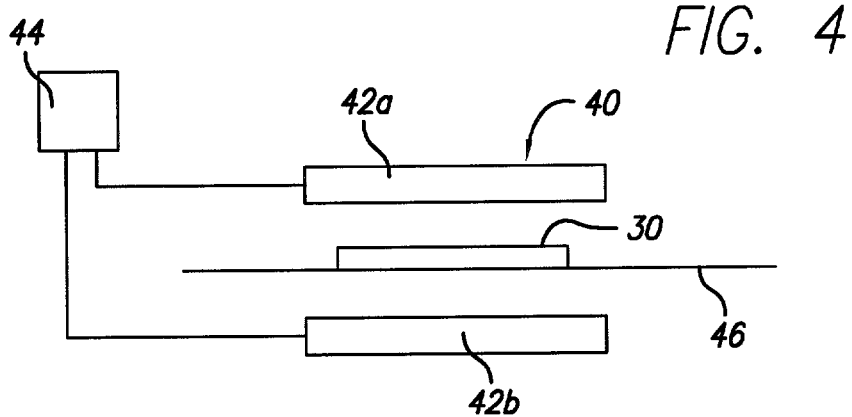
FIG. 4 is a side view of an exemplary electromagnetic field generating circuit using parallel plate field coils.

FIG. 4 shows an exemplary electromagnetic field generating circuit 40 using parallel plate field coils 42a, 42b. It should be appreciated that "coil" is not used in a geometrically limiting sense, but rather to describe the component of a field generating circuit from which the electromagnetic field used for the inductive heating application emanates. In circuit 40, the coils are substantially planar plates 42a, 42b that are oriented parallel to and spaced apart from one another, and do not resemble a coiled or helical shape in any respect. Nevertheless any shape may be used, including helical. The oscillating electromagnetic field is generated between the coils 42a, 42b. Coils 42a, 42b comprise solid plates of a conductive, non-magnetic material, such as copper. In the alternative, coils 42a, 42b are provided with an internal cavity, or with internal or external conduits, through which a coolant, such as water, may be circulated to cool the coils during operation of circuit 40. Each coil 42a, 42b is connected to an output of a generator apparatus 44 for generating and controlling the electrical current that drives the coils 42a, 42b. Suitable apparatus for driving coils 42a, 42b are known in the art and are commercially available.

In an embodiment of the invention, the article 30 to be processed is placed between the coils 42a, 42b, and may be positioned so that microelectronic structures on any given surface of the article 30 will be exposed to generally the same intensity of electromagnetic field. Preferably, the edges of the coils 42a, 42b extend beyond the periphery of the article 30, so that fringe effects of the coils may be ignored. The article is supported by a support 46 that is preferably non-metallic and non-magnetic, and will not be heated by operation of the oscillating electromagnetic field between coils 42a, 42b. Unlike prior art method for inductive heating of primarily non-metallic articles, heating of the support 46 typically is not desirable. The support 46 may comprise a conveyor, such as a belt conveyor, or a stationary support.

Figure 5:
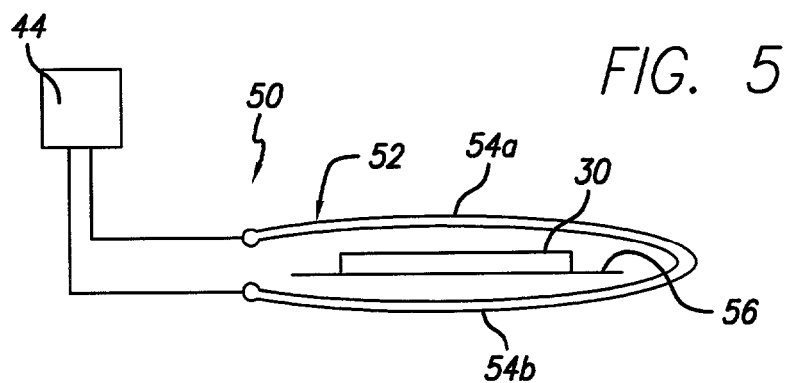
FIG. 5 is a side view of an exemplary electromagnetic field generating circuit using a hairpin field coil.
Figure 6:
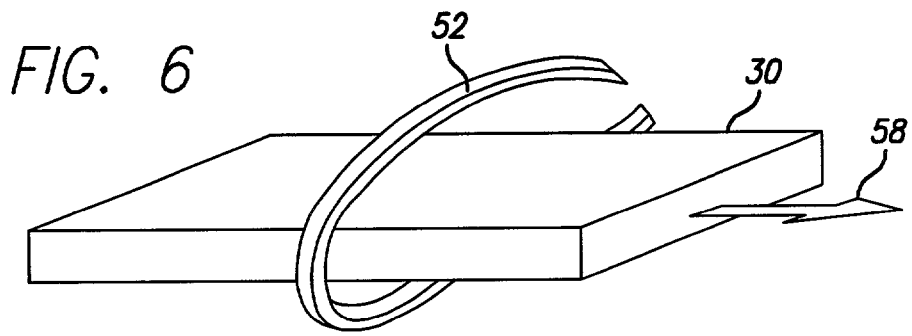
FIG. 6 is a perspective view of the hairpin coil shown in FIG. 5, in relation to an article as shown in FIG. 2 to be processed by inductive heating.

FIG. 5 shows an exemplary electromagnetic field generating circuit 50 using a hairpin field coil 52, according to an alternative embodiment of the invention. Circuit 50 is also driven by an apparatus 44, like circuit 40. It should be appreciated, however, that the apparatus 44 must be adjusted differently to account for the different characteristics of hairpin coil 52 relative to plate coils 42a, 42b, as known in the art. Hairpin coil 52 comprises two opposing arms 54a, 54b. Article 30 is preferably placed between the opposing arms 54a, 54b on a support 56. Because coil 52 is typically narrower than the article 30, at least one of support 56 or coil 52 is preferably movable with respect to the other, so that every part of article 30 may be scanned by the oscillating electromagnetic field between the arms 54a, 54b. Hairpin coil 52 typically comprises a tube, such as a rectangular tube, of a conductive, non-magnetic metal such as copper. Cooling water may be circulated within the interior of coil 52, as known in the art. FIG. 6 shows a perspective view of the hairpin coil 52, in relation to article 30. The direction of relative movement between article 30 and coil 52 in a scanning mode is indicated by arrow 58. Operation in an opposite direction is also possible.

Figure 7:
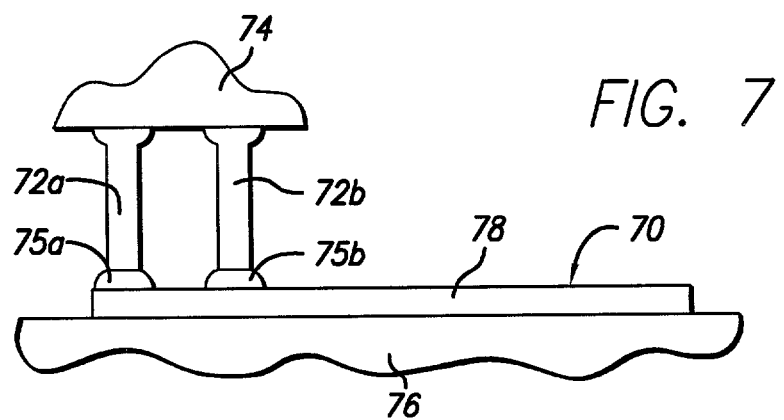
FIG. 7 is an enlarged side view of an exemplary microelectronic structure with separate components ready to be joined by inductive heating.

The heating method 10 is useful not only for relatively low-temperature heat-treatment of resilient elements, but also for higher temperature processes such as soldering, brazing, or alloying. For example, temperatures in excess of 800° C. and in excess of 1300° C. are readily and quickly attainable. FIG. 7 is a greatly enlarged side view of an exemplary microelectronic structure 70 with separate components 72a, 72b, and 78 ready to be joined by inductive heating of dollops 75a, 75b of a heat-activated joining material, such as solder. Dollops 75a, 75b are preferably placed on beam component 78, which is attached to sacrificial substrate 76. A plurality of like beam components (not shown) are typically provided in the sacrificial substrate 76, each in a position corresponding to one or more post components, such as columns 72a, 72b on substrate 74. Substrates 74, 76 are then mated in opposing relationship so that posts 72a, 72b are inserted into dollops 75a, 75b, as shown in FIG. 7. The substrates are then temporarily stabilized in this position and inserted together into an oscillating electromagnetic field, as previously described. The structure 70 is maintained in the electromagnetic field until the dollops 75a, 75b are activated, thereby joining columns 72a, 72b to beam component 78 to form structure 70. It should be apparent that the method 10 is not limited to joining components of the particular shape shown in FIG. 7.

The following section describes various different types of microelectronic structures, and in particular, microelectronic spring contacts, that may be heat-treating according to the invention. While the invention is not limited to the particular shapes and structures described below, the examples are helpful for describing examples of types of microelectronic elements for which the invention may be utilized.

Figure 8:
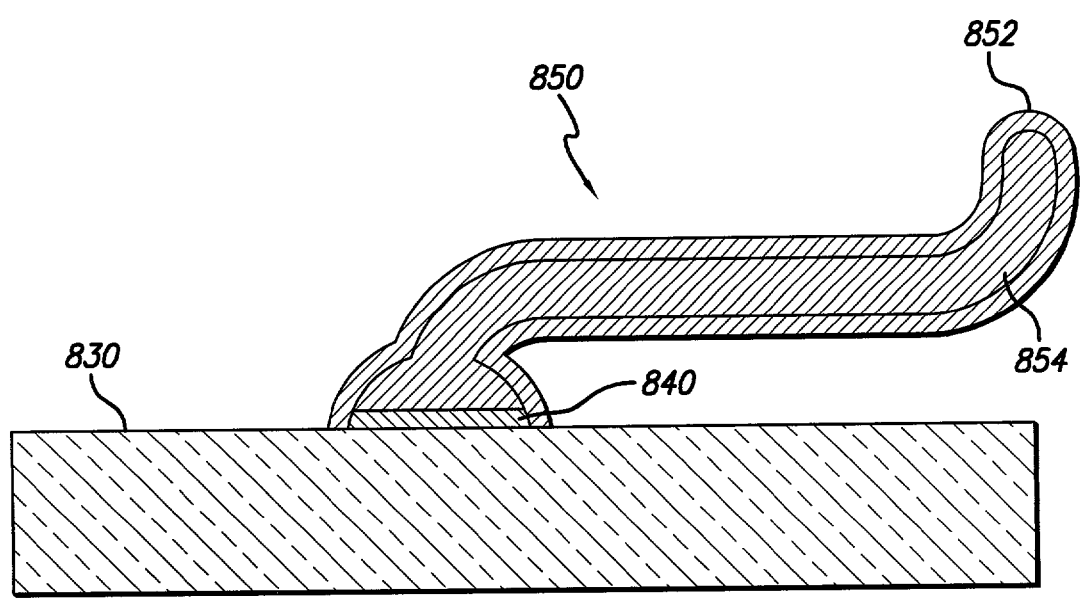
FIG. 8 is an enlarged cross-sectional view of an exemplary microelectronic structure suitable for heat treatment by inductive heating.

FIG. 8 illustrates a cross-sectional view of an exemplary elongate, resilient interconnect element 850. The interconnect element 850 comprises a wire core 854 that is wire bonded to terminal 840 on wafer 830. Standard wire bonding techniques may be used. The wire core 854 is preferably made of a soft, readily shapeable material, such as gold or a gold alloy. Depending on the material selected, the wire core 854 may be formed into just about any shape. A soft, readily shapeable material, however, is usually not particularly strong or resilient.

To make the structure strong and/or resilient, a coating 852 is formed over the wire core 854. The coating 852 is preferably made of a material that is stronger, harder and/or more resilient than the wire core 854. If this is the case, the coating 852 imparts strength, hardness, and/or resiliency to the interconnect element 850. By using a combination of a soft, readily shapeable material for the wire core 854 and a stronger, more resilient material for the coating 852, strong, resilient interconnect structures 850 may be formed in practically any shape.

Advantageously, the coating 852 may be a ferromagnetic material, such as a nickel-cobalt alloy. As described above, such materials will heat more rapidly than non-ferromagnetic materials when in the presence of an oscillating electromagnetic field, enhancing the selective heating effect provided by the present invention and enabling heat-treatment of the ferromagnetic material without overheating adjacent materials.

It should be apparent that the shape illustrated in FIG. 8 is exemplary only. For example, elongate shapes with one or more changes in direction, bends, zigs, zags, etc. in any direction (e.g., the "x,", "y," and/or "z" directions with respect to FIG. 8) can be formed.

Although the interconnect element 850 illustrated in FIG. 8 consists of two materials (a wire core 854 and a coating 852), additional materials may be included in the composition of the interconnect element. For example, one or more additional coatings of materials may be included between the wire core 854 and the coating 852. Likewise, one or more coatings of other materials may be formed over coating 852. In addition, additives may optionally be added to one or more of the materials that comprise the interconnect structure 850. Exemplary additives are described in U.S. Pat. No. 6,150,186, which is incorporated herein by reference. In particular, the interconnect structure may be heat treated according to the present invention to improve or manipulate physical and mechanical properties of the structure. Many variations of the interconnect element illustrated in FIG. 8, including shapes, structures, and manufacturing processes are described in detail in U.S. Pat. No. 5,476,211, U.S. Pat. No. 5,917,707, and U.S. application Ser. No. 08/452,255, filed May 26, 1995, all of which are incorporated herein by reference.

Elongate interconnect elements may alternatively be formed lithographically.

Figure 9A:
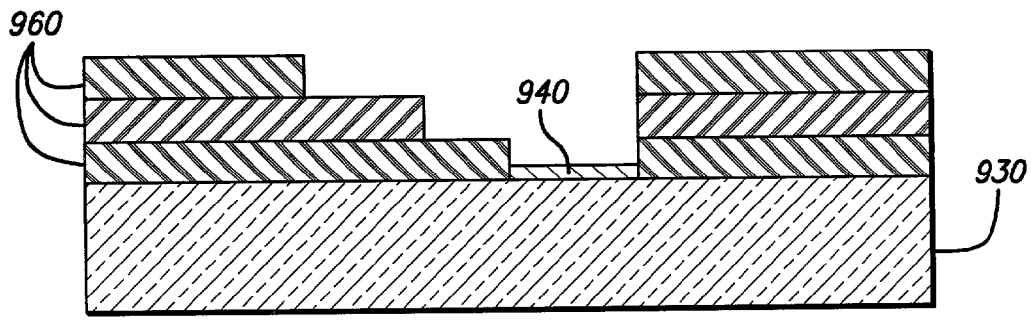
FIGS. 9A–9c are enlarged cross-sectional views showing exemplary steps of a method for making a microelectronic springs contact, and the resulting structure which is suitable for heat treatment by inductive heating.
Figure 9B:
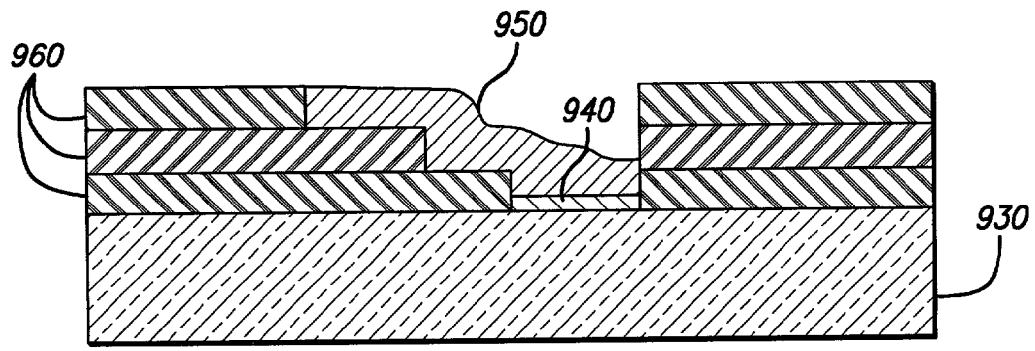
Figure 9C:
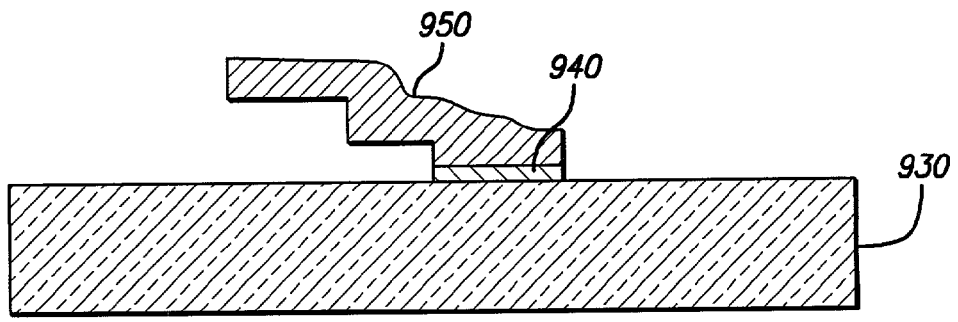

FIGS. 9A–11D illustrate exemplary lithographic processes for forming elongate, resilient interconnect elements that may be used with the present invention. In FIG. 9A, one or more layers of masking materials 960 are formed on wafer 930. The masking layers 960 define both an opening exposing a terminal 940 and a shape for an elongate, resilient interconnect element 950 that is to be formed on the terminal. Once the masking layers 960 are formed on the wafer 940, material is deposited on the masking layers 960, forming interconnect element 950 on terminal 940 as shown in FIG. 9B. Thereafter, masking layers 960 are removed, leaving elongate interconnect element 950 attached to terminal 940, as shown in FIG. 9C.

Standard lithographic techniques known to those in the semiconductor field may be used to form the masking layers 960 on the wafer 930. The material deposited on the masking layers 960 may be a single, springy material. Alternatively, multiple depositions of different materials may be made on the masking layers 960 so that the interconnect element 950 is ultimately made of multiple layers of different materials. Moreover, the interconnect element 950 may be further processed after masking layers 960 are removed from the wafer 930. For example, the initial material deposited in the masking layers 960 may be a soft, readily shapeable material such as forms the inner core of the interconnect element 850 illustrated in FIG. 8. That material may then be coated, for example, after the masking layers 960 are removed, with a strong, resilient material as described above with regard to FIG. 8.

In either case, a ferromagnetic material such as a nickel-cobalt alloy may be used as a resilient core or shell material. As previous described with respect to element 850, the use of a ferromagnetic material advantageously improves selectivity of heating obtained using the present invention during heat treatment of the interconnection element 950. However, the use of a ferromagnetic material is not necessary for application of the present invention for heat treatment or for any other purpose.

As should be apparent, the shapes and configurations of interconnection elements formed lithographically are almost limitless. By appropriately forming the masking layers 960, interconnection elements 950 having just about any contour, bend, change in direction, zig, zag, etc. in any location or direction (e.g., in any of the "x," "y," and/ or "z" directions with respect to FIGS. 9A–9C) may be formed.

Figure 10A:
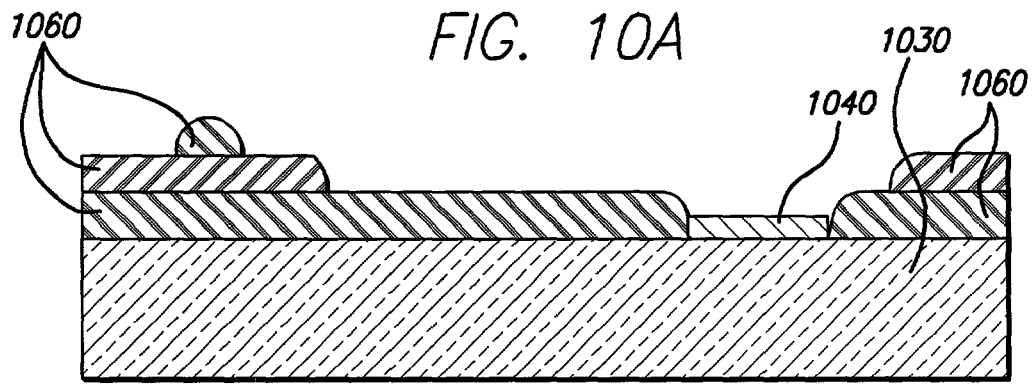
FIGS. 10A–10C are enlarged cross-sectional views showing exemplary steps of an alternative method for making a microelectronic spring contact, and the resulting structure which is suitable for heat treatment by inductive heating.
Figure 10B:
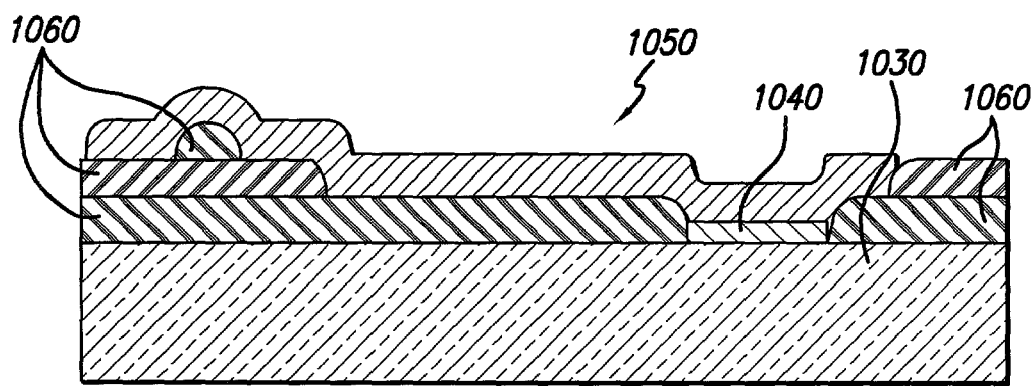
Figure 10C:
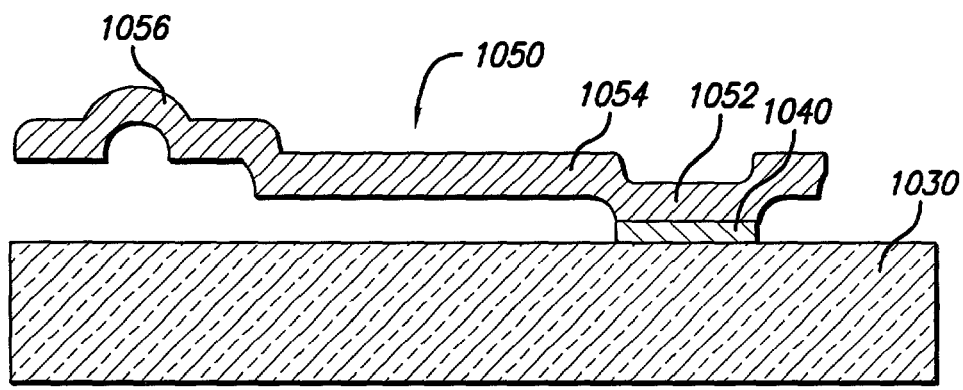

One of many possible shapes is illustrated by FIGS. 10A–10C showing a nonexclusive example of a interconnect element 1050 and steps during its formation. Element 1050 is formed to have a base portion 1052 attached to a terminal 1040 on a wafer 1030, a beam portion 1054, and a contact portion 1056. As shown in FIGS. 10A and 10B, masking layers 1060 form a pattern into which one or more materials are deposited to form the interconnect element 1050. Removing masking layers 1060 leaves interconnect element 1050 attached to terminal 1040 on wafer 1030, as shown in FIG. 10C.

Figure 11A:
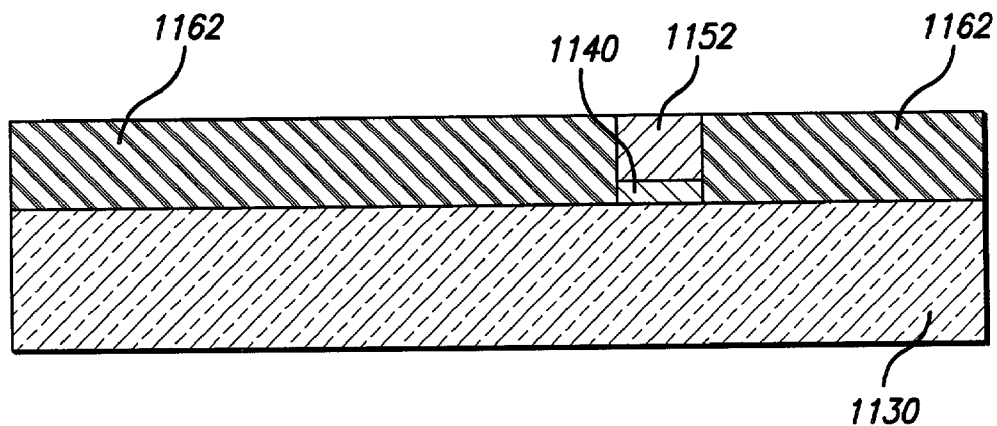
FIGS. 11A–11D are enlarged cross-sectional views showing exemplary steps of another alternative method for making a microelectronic spring contact, and the resulting structure which is suitable for heat treatment by inductive heating.
Figure 11B:
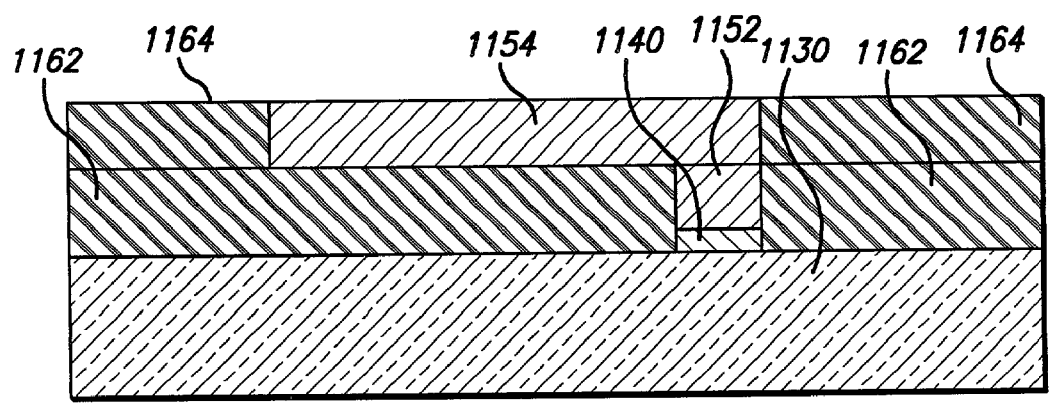
Figure 11C:
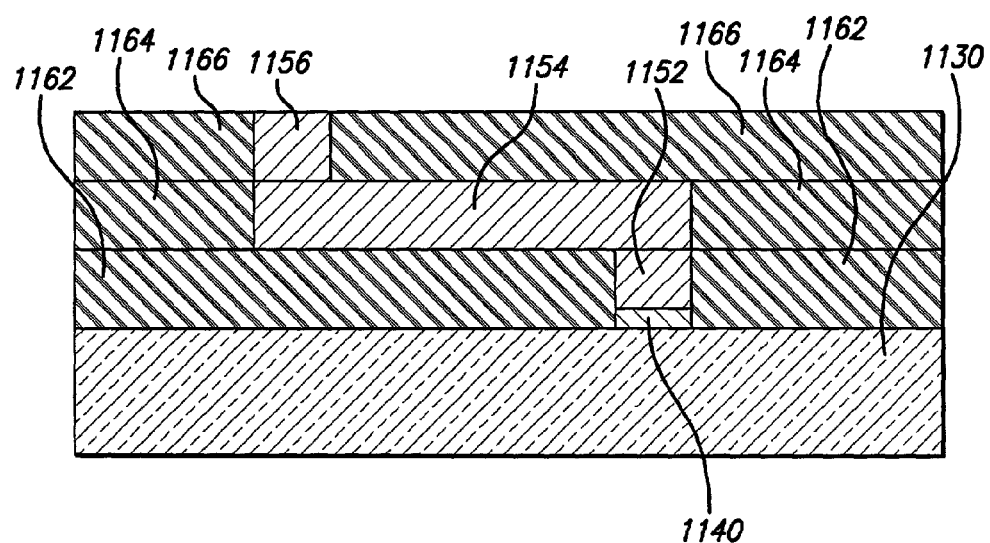
Figure 11D:
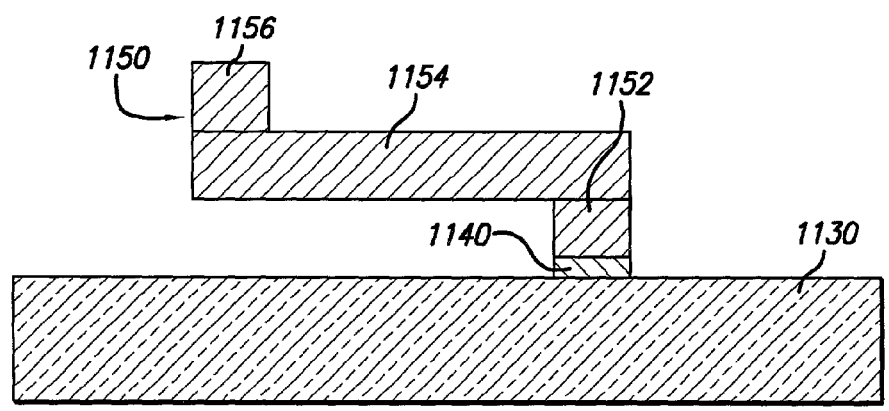

FIGS. 11A–11D illustrate an example of a lithographically formed spring contact 1150 in which distinct post 1152, beam 1154, and tip 1156 portions are separately created. Typically, the post 1152 is created by forming a first masking layer 1162 on wafer 1130 with an opening over terminal 1140. The post portion 1152 is then formed by filling the opening with a material suitable for the post as shown in FIG. 11A. Thereafter, a second masking layer 1164 is formed over the first masking layer 1162, defining an opening that includes the post 1152 and defines the beam 1154. The beam 1154 is then created by filling the opening with a material suitable for the beam as shown in FIG. 11B. The process is then repeated with a third masking layer 1166 defining the tip 1156 as shown in FIG. 11C. Thereafter, the masking layers 1162, 1164, 1166 are removed, leaving interconnect structure 1150 attached to the terminal 1140. It should be noted that a separate contact tip that is pointed or otherwise angled may be attached to the tip portion 1156.

It should be noted that, rather than forming the interconnect elements 950, 1050, 1150 on the wafer 930, 1030, 1130, the interconnect elements may be formed separately from the wafer and, once formed, attached to the wafer so as to line up with terminals on dice composing the wafer. It should be apparent that the use of lithographic methods for forming interconnection elements on a wafer, such as the methods described above, allow for the placement of the interconnection elements in just about any location desired on the wafer and the formation of interconnection elements in just about any shape imaginable.

Many exemplary techniques and processes for lithographically forming interconnection elements on a substrate, such as semiconductor wafer, and many exemplary interconnection elements shapes are described in the following U.S. patents and patent applications, all of which are incorporated herein by reference: U.S. patent application Ser. No. 08/802,054, filed Feb. 18, 1997; U.S. Pat. No. 6,184,053; U.S. patent application Ser. No. 09/032,473, filed Feb. 26, 1998; U.S. patent application Ser. No. 09/205,022, filed Dec. 2, 1998; U.S. patent application Ser. No. 09/205,023, filed Dec. 2, 1998; U.S. patent application Ser. No. 09/473,414, filed Dec. 28, 1999; U.S. patent application Ser. No. 09/474,788, filed Dec. 29, 1999; U.S. patent application Ser. No. 09/710,539, filed Nov. 9, 2000; U.S. patent application Ser. No. 09/781,833, filed Feb. 12, 2001; U.S. patent application Ser. No. 09/795,772, filed Feb. 27, 2001; and U.S. patent application Ser. No. 09/880,658, filed Jun. 13, 2001. Any such interconnection element may be used with the present invention. In addition, the physical and mechanical properties of such interconnection elements may be manipulated by including particular additives in the materials used to form the interconnection elements and/or by heat treating as described above.

Having thus described a preferred embodiment of the method and system for inductive heating of microelectronic components, it should be apparent to those skilled in the art that certain advantages of the within system have been achieved. It should also be appreciated that various modifications, adaptations, and alternative embodiments thereof may be made within the scope and spirit of the present invention. For example, specific examples of field-generating coils have been illustrated, but it should be apparent that the inventive concepts described above using various other methods for generating an oscillating electromagnetic field. As another example, although the invention is described above as having particular applicability to heat treating microelectronic components, the invention may be used to heat treat other types of metallic components or structures.

What is claimed is:

1. A method for heat treating a plurality of conductive interconnect structures attached to a substrate, the method comprising the steps of:
    providing a contactor comprising a substrate and a plurality of conductive interconnect structures;
    placing the contactor in an oscillating electromagnetic field, the oscillating electromagnetic field heating the interconnect structures without substantially heating the substrate; and
    maintaining the contactor in the oscillating electromagnetic field until each of the interconnect structures obtains a defined heat-treatment temperature substantially greater than an ambient temperature for a predetermined period of time sufficient to permanently change a mechanical operating property of the interconnect structures,
    further comprising tuning a frequency of the oscillating electromagnetic field to between about 10 MHz–15 MHz.

2. The method according to claim 1, wherein the interconnect structures are comprised of a ferromagnetic material.

3. The method according to claim 2, wherein the ferromagnetic material is a nickel-cobalt alloy.

4. The method according to claim 2, further comprising tuning the oscillating electromagnetic field to selectively heat the ferromagnetic material.

5. The method according to claim 1, wherein the maintaining step further comprises obtaining the heat-treatment temperature greater than 800° C.

6. The method according to claim 1, further comprising generating the oscillating electromagnetic field between a pair of parallel plates.

7. The method according to claim 1, further comprising generating the oscillating electromagnetic field between arms of a hairpin coil.

8. The method according to claim 1, further comprising generating the oscillating electromagnetic field using a coil comprised of a copper tube formed into a coil shape.

9. The method according to claim 1, further comprising tuning a frequency of the oscillating electromagnetic field to a resonant frequency of a field generator circuit.

10. The method according to claim 1, further comprising measuring a temperature of the interconnect structures by applying a heat-indicating paint to the plurality of interconnect structures prior to the maintaining step.

11. The method according to claim 1 wherein the mechanical operating property of the interconnect structures changed is at least one of greater yield strength, greater resistance to fatigue, decreased brittleness, or greater hardness.

12. The method according to claim 1, wherein the contactor comprises an interposer and the plurality of conductive interconnect structures are disposed on opposing sides of the substrate.

13. The method according to claim 1, wherein the contactor is for contacting a semiconductor wafer.

14. The method according to claim 1, wherein the interconnect structures are springs.

15. The method according to claim 14, wherein the mechanical operating property of the interconnect structures changed is a spring characteristic of the interconnect substrates.

16. The method according to claim 1, wherein each of the interconnect structures is attached to a terminal on the substrate and comprises a contact tip disposed away from the substrate.

17. The method according to claim 16 further comprising:
removing the contactor from the oscillating electromagnetic field; and
cooling the interconnect structures to the ambient temperature.

18. The method of claim 1, wherein the maintaining step comprises heating the interconnect structures to a temperature that is less than the melting temperature of the interconnect structures.

19. The method of claim 1, wherein the oscillating electromagnetic field induces electrical currents in the interconnect structures.

20. A method for heat treating a plurality of conductive interconnect structures attached to a substrate, the method comprising the steps of:
providing a contactor comprising a substrate and a plurality of conductive interconnect structures;
placing the contactor in an oscillating electromagnetic field, the oscillating electromagnetic field heating the interconnect structures without substantially heating the substrate; and
maintaining the contactor in the oscillating electromagnetic field until each of the interconnect structures obtains a defined heat-treatment temperature substantially greater than an ambient temperature for a predetermined period of time sufficient to permanently change a mechanical operating property of the interconnect structures,
wherein the maintaining step further comprises obtaining the heat-treatment temperature greater than 1300° C.

* * * * *